United States Patent
Riedmiller et al.

(10) Patent No.: US 10,566,006 B2
(45) Date of Patent: *Feb. 18, 2020

(54) SYSTEM AND METHOD FOR NON-DESTRUCTIVELY NORMALIZING LOUDNESS OF AUDIO SIGNALS WITHIN PORTABLE DEVICES

(71) Applicants: Dolby Laboratories Licensing Corporation, San Francisco, CA (US); DOLBY INTERNATIONAL AB, Amsterdam Zuidoost (NL)

(72) Inventors: Jeffrey Riedmiller, Novato, CA (US); Harald Mundt, Fürth (DE); Michael Schug, Erlangen (DE); Martin Wolters, Nürnberg (DE)

(73) Assignees: Dolby Laboratories Licensing Corporation, San Francisco, CA (US); Dolby International AB, Amsterdam Zuidoost (NL)

(*) Notice: Subject to any disclaimer, the term of this patent is extended or adjusted under 35 U.S.C. 154(b) by 0 days.

This patent is subject to a terminal disclaimer.

(21) Appl. No.: 16/504,076

(22) Filed: Jul. 5, 2019

(65) Prior Publication Data

US 2019/0325886 A1 Oct. 24, 2019

Related U.S. Application Data

(60) Continuation of application No. 15/482,328, filed on Apr. 7, 2017, now Pat. No. 10,418,045, which is a (Continued)

(51) Int. Cl.
*G10L 19/22* (2013.01)
*G10L 19/16* (2013.01)
(Continued)

(52) U.S. Cl.
CPC .............. *G10L 19/22* (2013.01); *G10L 19/02* (2013.01); *G10L 19/0208* (2013.01);
(Continued)

(58) Field of Classification Search
USPC .................................................. 704/500–504
See application file for complete search history.

(56) References Cited

U.S. PATENT DOCUMENTS 7,072,477 B1   7/2006   Kincaid
7,369,906 B2   5/2008   Frindle
(Continued)

FOREIGN PATENT DOCUMENTS

CN   2005800204845   5/2007
EP       2149983      2/2010
(Continued)

OTHER PUBLICATIONS

"A Guide to Dolby Metadata" Jan. 1, 2005, pp. 1-28 (available at http://www.dolby.com/us/en/technologies/a-guide-to-dolby-metadata.pdf).
(Continued)

*Primary Examiner* — Leonard Saint Cyr

(57) ABSTRACT

Many portable playback devices cannot decode and playback encoded audio content having wide bandwidth and wide dynamic range with consistent loudness and intelligibility unless the encoded audio content has been prepared specially for these devices. This problem can be overcome by including with the encoded content some metadata that specifies a suitable dynamic range compression profile by either absolute values or differential values relative to another known compression profile. A playback device may also adaptively apply gain and limiting to the playback audio. Implementations in encoders, in transcoders and in decoders are disclosed.

9 Claims, 3 Drawing Sheets

Related U.S. Application Data division of application No. 14/525,536, filed on Oct. 28, 2014, now Pat. No. 9,646,622, which is a continuation of application No. 13/576,386, filed as application No. PCT/US2011/023531 on Feb. 3, 2011, now Pat. No. 8,903,729.

(60) Provisional application No. 61/303,643, filed on Feb. 11, 2010.

(51) Int. Cl.
| | |
|---|---|
| *G10L 19/02* | (2013.01) |
| *H03G 7/00* | (2006.01) |
| *H03G 3/32* | (2006.01) |
| *G10L 19/26* | (2013.01) |
| *H03G 3/30* | (2006.01) |

(52) U.S. Cl.
CPC ............ *G10L 19/167* (2013.01); *G10L 19/26* (2013.01); *H03G 3/3089* (2013.01); *H03G 3/32* (2013.01); *H03G 7/007* (2013.01)

(56) References Cited

U.S. PATENT DOCUMENTS

| | | | |
|---|---|---|---|
| 7,617,109 | B2 | 11/2009 | Smithers |
| 7,729,673 | B2 | 6/2010 | Romesburg |
| 8,032,385 | B2 | 10/2011 | Smithers |
| 8,315,396 | B2 | 11/2012 | Schreiner |
| 8,781,820 | B2 | 7/2014 | Seguin |
| 8,798,776 | B2 | 8/2014 | Schildbach |
| 8,903,098 | B2 | 12/2014 | Tsuji |
| 8,903,729 | B2 | 12/2014 | Riedmiller et al. |
| 8,965,774 | B2 | 2/2015 | Eppolito |
| 8,989,884 | B2 | 3/2015 | Guetta |
| 9,240,763 | B2 | 1/2016 | Baumgarte |
| 9,294,062 | B2 | 3/2016 | Hatanaka |
| 9,300,268 | B2 | 3/2016 | Chen |
| 9,542,952 | B2 | 1/2017 | Hatanaka |
| 9,576,585 | B2 | 2/2017 | Bleidt |
| 9,608,588 | B2 | 3/2017 | Baumgarte |
| 9,633,663 | B2 | 4/2017 | Heuberger |
| 9,646,622 | B2 | 5/2017 | Riedmiller et al. |
| 9,830,915 | B2 | 11/2017 | Schreiner |
| 9,836,272 | B2 | 12/2017 | Kono |
| 2006/0002572 | A1 | 1/2006 | Smithers |
| 2008/0025530 | A1 | 1/2008 | Romesburg |
| 2009/0265167 | A1 | 10/2009 | Ehara |
| 2009/0281801 | A1 | 11/2009 | Thyssen |
| 2009/0281803 | A1 | 11/2009 | Chen |
| 2009/0281805 | A1 | 11/2009 | Leblanc |
| 2009/0287496 | A1 | 11/2009 | Thyssen |
| 2010/0014962 | A1 | 1/2010 | Arrieta |
| 2010/0083344 | A1 | 4/2010 | Schildbach |
| 2010/0135507 | A1 | 6/2010 | Kino |
| 2010/0250258 | A1 | 9/2010 | Smithers |
| 2012/0275625 | A1 | 11/2012 | Kono |
| 2013/0094669 | A1 | 4/2013 | Kono |
| 2016/0225376 | A1 | 8/2016 | Honma |
| 2016/0315722 | A1 | 10/2016 | Holman |
| 2016/0351202 | A1 | 12/2016 | Baumgarte |
| 2017/0092280 | A1 | 3/2017 | Hirabayashi |
| 2017/0223429 | A1 | 8/2017 | Schreiner |

FOREIGN PATENT DOCUMENTS

| | | |
|---|---|---|
| EP | 3089161 | 11/2016 |
| JP | 2005537510 | 12/2005 |
| JP | 2007109328 | 4/2007 |
| JP | 2008505586 | 2/2008 |
| WO | 2011131732 | 10/2011 |
| WO | 2014111290 | 7/2014 |
| WO | 2014160849 | 10/2014 |
| WO | 2014160895 | 10/2014 |
| WO | 2015059087 | 4/2015 |
| WO | 2015088697 | 6/2015 |
| WO | 2015144587 | 10/2015 |
| WO | 2015148046 | 10/2015 |
| WO | 2016075053 | 5/2016 |
| WO | 2016193033 | 12/2016 |
| WO | 2016202682 | 12/2016 |
| WO | 2017023423 | 2/2017 |
| WO | 2017023601 | 2/2017 |
| WO | 2017058731 | 4/2017 |
| WO | 2016002738 | 5/2017 |

OTHER PUBLICATIONS

ATSC Recommended Practice: Techniques for Establishing and Maintaining Audio Loudness for Digital Television, Document A/85, Nov. 4, 2009, published by the Advanced Television Systems Committee, Inc.
ATSC Standard, "Digital Audio Compression Standard" Revision B, document A/52B, Jun. 14, 2005.
DVD Dolby Digital Dec. 25, 2003, pp. 41-46.
ISO/IEC 13818-7, "Advanced Audio Coding".
ISO/IEC 14496-3, "Coding of Audio-visual Object—Part 3: Audio".
Kudumakis—107th MPEG San Jose (CA), USA, Jan. 13-17, 2014, Meeting Report Panos Kudumakis qMedia, Queen Mary University of London (7 pgs.).
Kudumakis—108th MPEG Valencia, Spain, Mar. 31-Apr. 4, 2014, Meeting Report Panos Kudumakis qMedia, Queen Mary University of London (9 pgs.).
Masaaki Fushiki, "Audio Encoding Now in Daily Life Encoding in Film and DVD—Dolby Digital", Journal of Japanese Society of Acoustics, Japan, Dec. 25, 2003, vol. 60, No. 1, pp. 41-46.
Riedmiller, Jeffrey C. "An Analysis of Audio for Digital Cable Television Recommendations for the Digital Transition via Audio Metadata" NCTA Technical Papers, 2001, pp. 1-18.
Robinson, C.Q. et al., "Dynamic Range Control via Metadata" AES Conference Paper No. 8152, Presented at the 107th Convention, Sep. 24-27, 1999.
Robinson, D. "Replay Gain-a Proposed Standard" Oct. 10, 2001 Internet Citation.
Wolters, M. et al., "Loudness Normalization in the Age of Portable Media Players" AES Convention 128, May 2010, New York, USA.

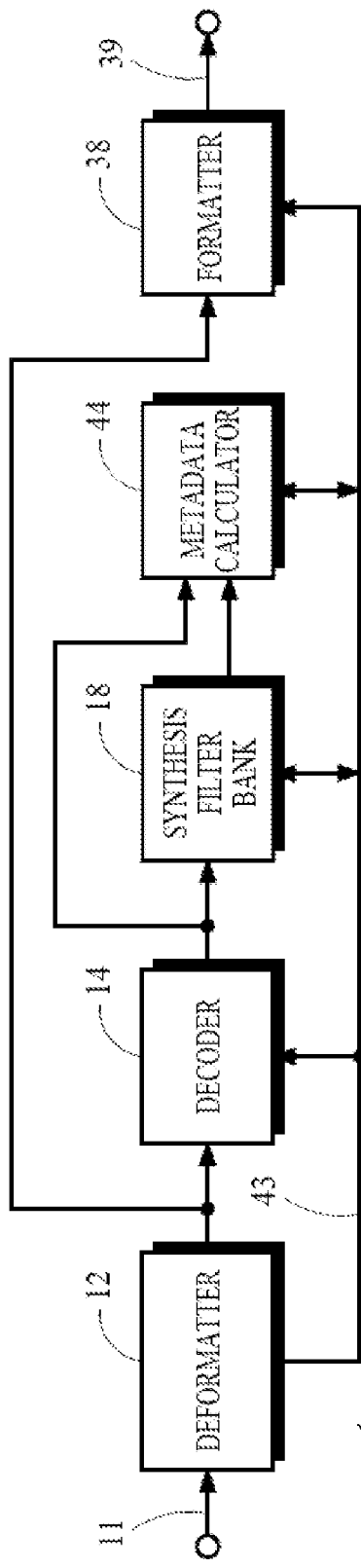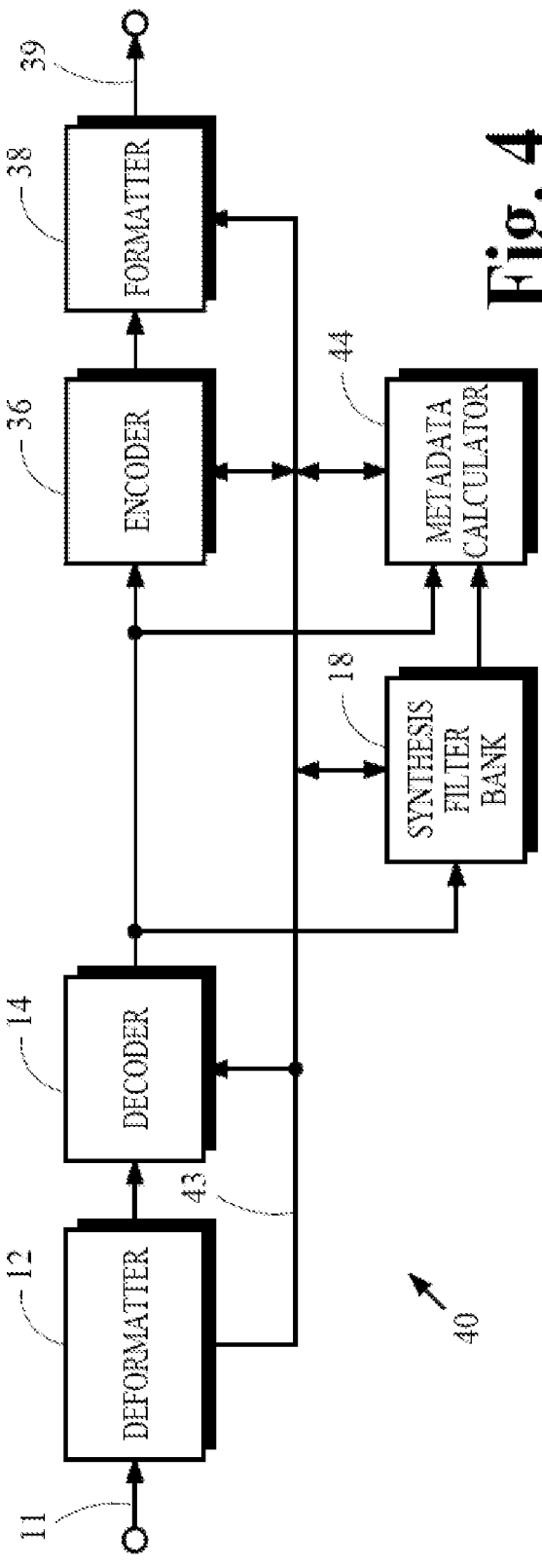

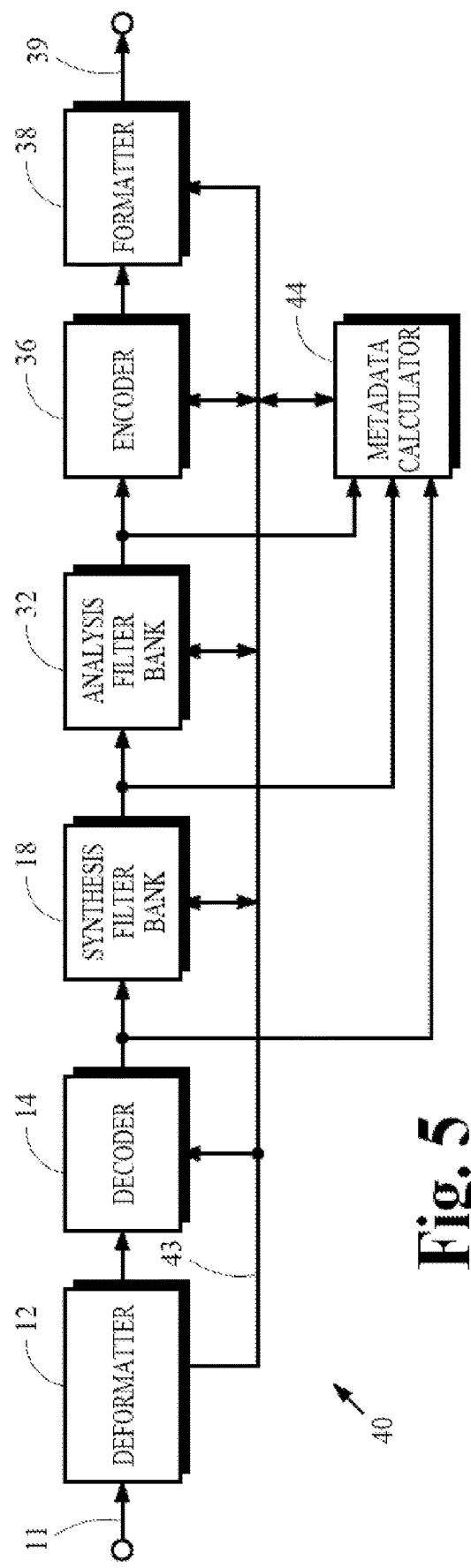
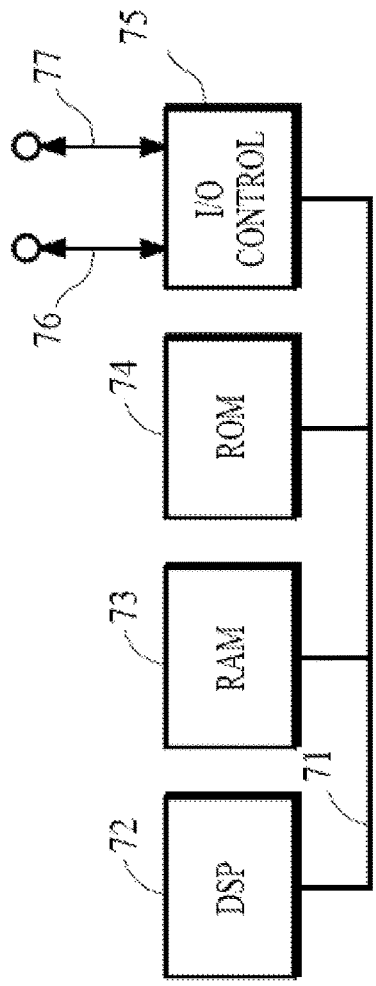
Fig. 5
Fig. 6

SYSTEM AND METHOD FOR NON-DESTRUCTIVELY NORMALIZING LOUDNESS OF AUDIO SIGNALS WITHIN PORTABLE DEVICES

CROSS REFERENCE TO RELATED APPLICATIONS

This application is continuation of U.S. patent application Ser. No. 15/482,328, filed Apr. 7, 2017, which is division of Ser. No. 14/525,536, filed Oct. 28, 2014, now U.S. Pat. No. 9,646,622, which is continuation of Ser. No. 13/576,386, filed Jul. 31, 2012, now U.S. Pat. No. 8,903,729, which is U.S. National Stage of PCT/US2011/023531, filed Feb. 3, 2011, which claims priority to U.S. Provisional Application No. 61/303,643, filed Feb. 11, 2010, each of which is hereby incorporated by reference in its entirety.

TECHNICAL FIELD

The present invention pertains generally to encoding and decoding audio signals and pertains more specifically to techniques that may be used to encode and decode audio signals for a wider range of playback devices and listening environments.

BACKGROUND ART

The increasing popularity of handheld and other types of portable devices has created new opportunities and challenges for the creators and distributors of media content for playback on those devices, as well as for the designers and manufacturers of the devices. Many portable devices are capable of playing back a broad range of media content types and formats including those often associated with high-quality, wide bandwidth and wide dynamic range audio content for HDTV, Blu-ray or DVD. Portable devices may be used to play back this type of audio content either on their own internal acoustic transducers or on external transducers such as headphones; however, they generally cannot reproduce this content with consistent loudness and intelligibility across varying media format and content types.

DISCLOSURE OF INVENTION

The present invention is directed toward providing improved methods for encoding and decoding audio signals for playback on a variety of devices including handheld and other types of portable devices.

Various aspects of the present invention are set forth in the independent claims shown below.

The various features of the present invention and its preferred embodiments may be better understood by referring to the following discussion and the accompanying drawings in which like reference numerals refer to like elements in the several figures. The contents of the following discussion and the drawings are set forth as examples only and should not be understood to represent limitations upon the scope of the present invention.

BRIEF DESCRIPTION OF DRAWINGS

FIGS. 3 to 5 are schematic block diagrams of transcoding devices.

FIG. 6 is a schematic block diagram of a device that may be used to implement various aspects of the present invention.

MODES FOR CARRYING OUT THE INVENTION

A. Introduction

Figure 1:
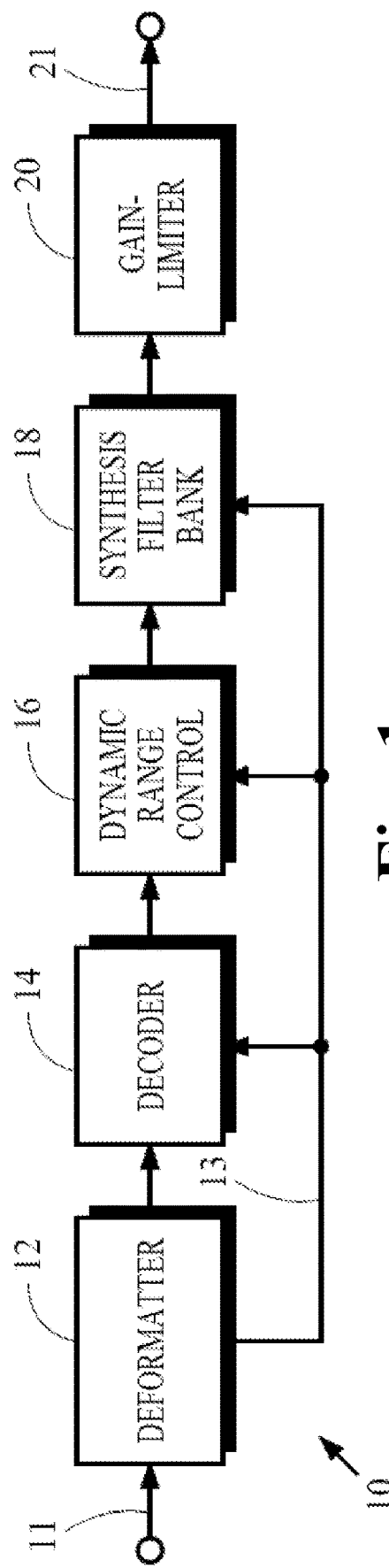
FIG. 1 is a schematic block diagram of a playback device.

The present invention is directed toward the encoding and decoding of audio information for playback in challenging listening environments such as those encountered by users of handheld and other types of portable devices. A few examples of audio encoding and decoding are described by published standards such as those described in the "Digital Audio Compression Standard (AC-3, E-AC-3)," Revision B, Document A/52B, 14 Jun. 2005 published by the Advanced Television Systems Committee, Inc. (referred to herein as the "ATSC Standard"), and in ISO/IEC 13818-7, Advanced Audio Coding (AAC) (referred to herein as the "MPEG-2 AAC Standard") and ISO/IEC 14496-3, subpart 4 (referred to herein as the "MPEG-4 Audio Standard") published by the International Standards Organization (ISO). The encoding and decoding processes that conform to these standards are mentioned only as examples. Principles of the present invention may be used with coding systems that conform to other standards as well.

The inventors discovered that the available features of devices that conform to some coding standards are often not sufficient for applications and listening environments that are typical of handheld and other types of portable devices. When these types of devices are used to decode the audio content of encoded input signals that conform to these standards, the decoded audio content is often reproduced at loudness levels that are significantly lower than the loudness levels for audio content obtained by decoding encoded input signals that were specially prepared for playback on these devices.

Encoded input signals that conform to the ATSC Standard (referred to herein as "ATSC-compliant encoded signals"), for example, contain encoded audio information and metadata that describe how this information can be decoded. Some of the metadata parameters identify a dynamic range compression profile that specifies how the dynamic range of the audio information may be compressed when the encoded audio information is decoded. The full dynamic range of the decoded signal can be retained or it can be compressed by varying degrees at the time of decoding to satisfy the demands of different applications and listening environments. Other metadata identify some measure of loudness of the encoded audio information such as an average program level or level of dialog in the encoded signal. This metadata may be used by a decoder to adjust amplitudes of the decoded signal to achieve a specified loudness or reference reproduction level during playback. In some applications, one or more reference reproduction levels may be specified or assumed, while in other applications the user may be given control over setting the reference reproduction level. For example, the coding processes used to encode and decode ATSC-compliant encoded signals assume that dialog is to be played back at one of two reference reproduction levels. One level is 31 dB below a clipping level, which is the largest possible digital value or full scale (FS) value, denoted herein as $-31\ dB_{FS}$. The mode of decoding that uses this level is sometimes referred to as "Line Mode" and is intended to be used in applications and environments where wider dynamic ranges are suitable. The other level is set at $-20$ dB$_{FS}$. The mode of decoding that uses this second level is sometimes referred to as "RF Mode," which is intended to be used in applications and environments like those encountered in broadcasting by modulation of radio frequency (RF) signals where narrower dynamic ranges are needed to avoid over modulation.

For another example, encoded signals that comply with the MPEG-2 AAC and MPEG-4 Audio standards include metadata that identifies an average loudness level for the encoded audio information. The processes that decode MPEG-2 AAC and MPEG-4 Audio compliant encoded signals may allow the listener to specify a desired playback level. The decoder uses the desired playback level and the average-loudness metadata to adjust amplitudes of the decoded signal so that the desired playback level is achieved.

When handheld and other types of portable devices are used to decode and playback the audio content of ATSC-compliant, MPEG-2 AAC-compliant, and MPEG-4 Audio-compliant encoded signals according to these metadata parameters, the dynamic range and loudness level are often not suitable either because of adverse listening environments that are encountered with these types of devices or because of electrical limitations due to lower operating voltages used in these devices.

Encoded signals that conform to other standards use similar types of metadata and may include a provision to specify the intended playback loudness level. The same problems are often encountered with portable devices that decode these signals.

The present invention may be used to improve the listening experience for users of handheld and portable devices without requiring content that has been prepared specially for these devices.

B. Device Overview

FIG. 1 is a schematic block diagram of one type of a receiver/decoder device 10 that incorporates various aspects of the present invention. The device 10 receives an encoded input signal from the signal path 11, applies suitable processes in the deformatter 12 to extract encoded audio information and associated metadata from the input signal, passes the encoded audio information to the decoder 14 and passes the metadata along the signal path 13. The encoded audio information includes encoded subband signals representing spectral content of aural stimuli and the metadata specify values for a variety of parameters including one or more decoding-control parameters and one or more parameters that specify dynamic range compression according to a dynamic range compression profile. The term "dynamic range compression profile" refers to features such as gain factors, compression attack times and compression release times that define the operational characteristics of a dynamic range compressor.

The decoder 14 applies a decoding process to the encoded audio information to obtain decoded subband signals, which are passed to the dynamic range control 16. The operation and functions of the decoding process may be adapted in response to decoding-control parameters received from the signal path 13. Examples of decoding-control parameters that may be used to adapt the operation and functions of the decoding process are parameters that identify the number and the configuration of the audio channels represented by the encoded audio information.

The dynamic range control 16 optionally adjusts the dynamic range of the decoded audio information. This adjustment may be turned on or off and adapted in response to metadata received from the signal path 13 and/or from control signals that may be provided in response to input from a listener. For example, a control signal may be provided in response to a listener operating a switch or selecting an operating option for the device 10.

In implementations that conform to the ATSC Standard, the MPEG-2 AAC standard or the MPEG-4 Audio standard, for example, the encoded input signal includes encoded audio information arranged in a sequence of segments or frames. Each frame contains encoded subband signals representing spectral components of an audio signal with its full dynamic range. The dynamic range control 16 may take no action, which allows the audio signal to be played back with a maximum amount of dynamic range, or it may modify the decoded subband signals to compress the dynamic range by varying degrees.

The synthesis filter bank 18 applies a bank of synthesis filters to the decoded subband signals, which may have been adjusted by the dynamic range control 16, and provides at its output a time-domain audio signal that may be a digital or an analog signal.

The gain-limiter 20 is used in some implementations of the present invention to adjust the amplitude of the time-domain audio signal. The output of the gain-limiter 20 is passed along the path 21 for subsequent presentation by an acoustic transducer.

Figure 2:
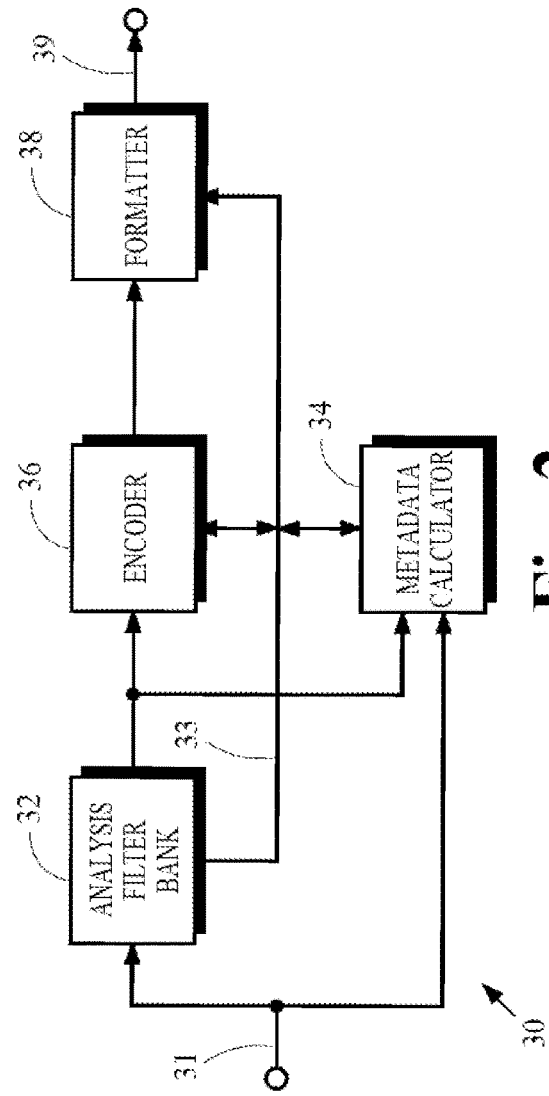
FIG. 2 is a schematic block diagram of an encoding device.

FIG. 2 is a schematic block diagram of an encoder/transmitter device 30 that incorporates various aspects of the present invention. The device 30 receives an audio input signal from the signal path 31 that represents aural stimuli. The device 30 applies a bank of analysis filters to the audio signal to obtain subband signals in either a frequency-domain representation of the input audio signal or a set of bandwidth-limited signals representing the input audio signal. The metadata calculator 34 analyzes the audio input signal and/or one or more signals derived from the audio input signal such as a modified version of the audio input signal or the subband signals from the analysis filter bank 32 to calculate metadata that specify values for a variety of parameters including encoding-control parameters, one or more decoding-control parameters and one or more parameters that specify dynamic range compression according to a dynamic range compression profile. The metadata calculator 34 may analyze time-domain signals, frequency-domain signals, or a combination of time-domain and frequency-domain signals. The calculations performed by the metadata calculator 34 may also be adapted in response to one or more metadata parameters received from path 33. The encoder 36 applies an encoding process to the output of the analysis filter bank 32 to obtain encoded audio information including encoded subband signals, which is passed to the formatter 38. The encoding process may be adapted in response to the encoding-control parameters received from the path 33. The encoding process may also generate other decoding-control parameters along the path 33 for use by processes performed in the device 10 to decode the encoded audio information. The formatter 38 assembles the encoded audio information and at least some of the metadata including the one or more decoding-control parameters and the one or more parameters that specify dynamic range compression into an encoded output signal having a format that is suitable for transmission or storage.

In implementations that conform to the ATSC Standard, the MPEG-2 AAC standard or the MPEG-4 Audio standard, for example, the encoded output signal includes encoded audio information arranged in a sequence of segments or frames. Each frame contains encoded subband signals representing spectral components of an audio signal with its full dynamic range and having amplitudes for playback at a reference reproduction level.

The deformatter 12, the decoder 14, the synthesis filter bank 18, the analysis filter bank 32, the encoder 36 and the formatter 38 may be conventional in design and operation. A few examples include the corresponding components that conform to the published standards mentioned above. The implementations of the components specified or suggested in these standards are suitable for use with the present invention but they are not required. No particular implementation of these components is critical.

FIGS. 3 to 5 are schematic block diagrams of different implementations of a transcoder device 40 that comprises some of the components in the device 10 and the device 30, described above. These components operate substantially the same as their counterparts. The device 40 shown in FIG. 3 is capable of transcoding the encoded input signal received from the path 11 into a modified version that conforms to the same coding standard. In this implementation, the device 40 receives an encoded input signal from the signal path 11, applies suitable processes in the deformatter 12 to extract first encoded audio information and associated metadata from the encoded input signal, passes the first encoded audio information to the decoder 14 and to the formatter 38, and passes the metadata along the signal path 43. The first encoded audio information includes encoded subband signals representing spectral content of aural stimuli and the metadata specify values for a variety of parameters including one or more decoding-control parameters and one or more parameters that specify dynamic range compression according to a first dynamic range compression profile. The decoder 14 applies a decoding process to the first encoded audio information to obtain decoded subband signals. The operation and functions of the decoding process may be adapted in response to the one or more decoding-control parameters received from the signal path 43. The subband signals may be either a frequency-domain representation of the aural stimuli or a set of bandwidth-limited signals representing the aural stimuli.

The metadata calculator 44 analyzes the decoded subband signals and/or one or more signals derived from the decoded subband signals to calculate one or more parameter values that specify dynamic range compression according to a second dynamic range compression profile. For example, the one or more signals may be derived by applying the synthesis filter bank 18 to the decoded subband signals. The calculations performed by the metadata calculator 44 may be adapted in response to metadata received from path 43. The synthesis filter bank 18 may be omitted from this implementation if its output is not needed for metadata calculation.

Another implementation of the device 40 is shown in FIG. 4. This implementation is similar to the one shown in FIG. 3 but includes the encoder 36. The inclusion of the encoder 36 allows the device 40 to transcode the encoded input signal received from the path 11, which conforms to a first coding standard, into an encoded output signal that conforms to a second coding standard that may be the same as or different from the first coding standard provided the subband signals of the two coding standards are compatible. This may be done in this implementation by having the encoder 36 apply an encoding process to the subband signals to obtain second encoded audio information that conforms to the second coding standard. The second encoded audio information is passed to the formatter 38. The encoding process may be adapted in response to metadata received from the path 43. The encoding process may also generate other metadata along the path 43 for use by processes performed in the device 10 to decode the encoded audio information. The formatter 38 assembles the metadata received from the path 43 and the encoded audio information that it receives into an encoded output signal having a format that is suitable for transmission or storage.

Yet another implementation of the device 40 is shown in FIG. 5. This implementation includes the synthesis filter bank 18, which is applied to the decoded subband signals to obtain a time-domain or wideband representation of the encoded audio information. The inclusion of the synthesis filter bank 18 and the analysis filter bank 32 allows the device 40 to transcode between essentially any choice of coding standards. The output of the synthesis filter bank 18 is passed to the analysis filter bank 32, which generates subband signals for encoding by the encoder 36. The encoder 36 applies an encoding process to the output of the analysis filter bank 32 to obtain second encoded audio information, which is passed to the formatter 38. The encoding process may also generate other metadata along the path 43 for use by processes performed in the device 10 to decode the encoded audio information. The metadata calculator 44 may calculate metadata parameter values from its analysis of any or all of the subband signals received from the decoder 14, the output of the synthesis filter bank 18, and the output of the analysis filter bank 32.

Some aspects of the device 10 and the device 30 are described below in more detail. These descriptions apply to the corresponding features of the device 40. These aspects are described in terms of features and characteristics of methods and devices that conform to the ATSC Standard mentioned above. These specific features and characteristics are discussed by way of example only. The principles underlying these implementations are directly applicable to methods and devices that conform to other standards.

C. Receiver/Decoder

The playback problems described above may be addressed by using one or more of three different techniques described below. The first technique uses gain-limiting and may be implemented by features in only the device 10. The second and third techniques use dynamic range compression and their implementations require features in both the device 10 and the device 30.

1. Gain-Limiter

The first technique operates the device 10 in RF Mode rather than in Line Mode so that it decodes an ATSC-compliant encoded input signal with the dynamic range control 16 providing higher levels of dynamic range compression and a higher reference reproduction level. The gain-limiter 20 provides additional gain, raising the effective reference reproduction level to a value from $-14$ $dB_{FS}$ to $-8$ $dB_{FS}$. Empirical results indicate a reference level equal to $-11$ $dB_{FS}$ gives good results for many applications.

The gain-limiter 20 also applies a limiting operation to prevent the amplified digital signal from exceeding 0 $dB_{FS}$. The operating characteristics of the limiter can affect perceived quality of the reproduced audio but no particular limiter is critical to the present invention. The limiter may be implemented in essentially any way that may be desired.

Preferably, the limiter is designed to provide a "soft" limiting function rather than a "hard" clipping function.

2. Differential Compression Values

The second technique allows the device 10 to apply one or more modified dynamic range compression parameters in the dynamic range control 16. The deformatter 12 obtains differential dynamic range compression (DRC) parameter values from the encoded input signal and passes the differential parameter values together with conventional DRC parameter values along the path 13 to the dynamic range control 16. The dynamic range control 16 calculates the one or more DRC parameter values it needs by arithmetically combining the conventional DRC parameter values with corresponding differential DRC parameter values. The gain-limiter 20 need not be used in this situation.

The differential DRC parameter values are provided in the encoded input signal by the encoder/transmitter device 30 that generated the encoded input signal. This is described below.

If the encoded input signal does not contain these differential DRC values, the device 10 can use the gain-limiter 20 according to the first technique described above.

3. Distinct Compression Profile

The third technique allows the device 10 to apply dynamic range compression according to a new dynamic range compression profile in the dynamic range control 16. The deformatter 12 obtains one or more DRC parameter values for the new profile from the encoded input signal and passes them along the path 13 to the dynamic range control 16. The gain-limiter 20 need not be used in this situation.

The DRC parameter values for the new dynamic range compression profile are provided in the encoded input signal by the encoder/transmitter device 30 that generated the encoded input signal. This is described below.

If the encoded input signal does not contain the one or more DRC parameter values for the new DRC profile the device 10 can use the gain-limiter 20 according to the first technique described above.

D. Encoder/Transmitter

1. Differential Compression Values

The processes for the second technique discussed above are implemented in the device 10 by using differential DRC parameter values that are extracted from the encoded input signal. These differential parameter values are provided by the device 30 that generated the encoded signal.

The device 30 provides a set of differential DRC parameter values that represent the difference between a set of DRC parameter values that will be present in the encoded signal and a set of corresponding base parameter values for a new DRC profile that are required to prevent the decoded audio signal samples from exceeding 0 $dB_{FS}$ for a higher reference reproduction level. No particular method for calculating the DRC parameter values is critical to the present invention. Known methods for calculating parameter values that comply with the ATSC Standard are disclosed in "ATSC Recommended Practice: Techniques for Establishing and Maintaining Audio Loudness for Digital Television," Document A/85, 4 Nov. 2009 published by the Advanced Television Systems Committee, Inc., especially Section 9 and Annex F, and in Robinson et al., "Dynamic Range Control via Metadata," preprint no. 5028, 107th AES Convention, New York, September 1999.

If the encoded output signal conforms to the ATSC Standard, the MPEG-2 AAC Standard or the MPEG-4 Audio Standard, the reference reproduction level is increased to a value from $-14$ $dB_{FS}$ to $-8$ $dB_{FS}$. Empirical results indicate a reference level equal to $-11$ $dB_{FS}$ gives good results for many applications.

For ATSC-compliant encoded output signals, the metadata calculator 34 calculates a differential parameter value for the corresponding base parameter "compr" specified in the standard. The formatter 38 may assemble the differential parameter value into portions of each encoded signal frame denoted as "addbsi" (additional bit stream information) and/or "auxdata" (auxiliary data). If the differential parameter values are assembled into the "addbsi" or the "auxdata" portions, the encoded signal will be compatible with all ATSC compliant decoders. Those decoders that do not recognize the differential parameter values can still process and decode the encoded signal frames correctly by ignoring the "addbsi" and "auxdata" portions. Refer to the A/52b document cited above for more details.

For encoded output signals that comply with the MPEG-2 AAC or MPEG-4 Audio standards, the formatter 38 may assemble the differential parameter values into portions of each encoded signal frame denoted as "Fill_Element" or "Data_Stream_Element" in the two standards. If the differential parameter values are assembled into either of these portions, the encoded signal will be compatible with all MPEG-2 AAC and MPEG-4 Audio standards compliant decoders. Refer to the ISO/IEC 13818-7 and ISO/IEC 14496-3 documents cited above for more details.

The differential parameter values may be calculated and inserted into the encoded signal at a rate that is greater than, equal to, or less than the rate at which the corresponding base parameter values are in the encoded signal. The rate for the differential values may vary. Flags or bits that indicate whether a previous differential value should be reused may also be included in the encoded signal.

2. Distinct Compression Profile

The processes for the third technique discussed above are implemented in the device 10 by using DRC parameter values for new dynamic range compression profile that are extracted from the encoded input signal. These parameter values are provided by the device 30 that generated the encoded signal.

The device 30 derives DRC parameter values for a new DRC profile by calculating the parameter values needed to prevent the decoded audio signal samples from exceeding 0 $dB_{FS}$ for a higher reference reproduction level.

If the encoded output signal conforms to the ATSC Standard, the MPEG-2 AAC Standard or the MPEG-4 Audio Standard, the metadata calculator 34 calculates a DRC compression value based on an assumption that the reference reproduction level is increased to a value from $-14$ $dB_{FS}$ to $-8$ $dB_{FS}$. Empirical results indicate a reference level equal to $-11$ $dB_{FS}$ gives good results for many applications. The formatter 38 may assemble the parameter value for the DRC profile into portions of each encoded signal frame as described above for the differential parameters. The use of these portions of the frames allow the encoded signal to be compatible with all decoders that comply with the respective standard.

E. Implementation

Devices that incorporate various aspects of the present invention may be implemented in a variety of ways including software for execution by a computer or some other device that includes more specialized components such as digital signal processor (DSP) circuitry coupled to components similar to those found in a general-purpose computer. FIG. 6 is a schematic block diagram of a device 70 that may be used to implement aspects of the present invention. The processor 72 provides computing resources. RAM 73 is system random access memory (RAM) used by the processor 72 for processing. ROM 74 represents some form of persistent storage such as read only memory (ROM) for storing programs needed to operate the device 70 and possibly for carrying out various aspects of the present invention. I/O control 75 represents interface circuitry to receive input signals and transmit output signals by way of the communication channels 76, 77. In the embodiment shown, all major system components connect to the bus 71, which may represent more than one physical or logical bus; however, a bus architecture is not required to implement the present invention.

In embodiments implemented by a general purpose computer system, additional components may be included for interfacing to devices such as a keyboard or mouse and a display, and for controlling a storage device 78 having a storage medium such as magnetic tape or disk, or an optical medium. The storage medium may be used to record programs of instructions for operating systems, utilities and applications, and may include programs that implement various aspects of the present invention.

The functions required to practice various aspects of the present invention can be performed by components that are implemented in a wide variety of ways including discrete logic components, integrated circuits, one or more ASICs and/or program-controlled processors. The manner in which these components are implemented is not important to the present invention.

Software implementations of the present invention may be conveyed by a variety of machine readable media such as baseband or modulated communication paths throughout the spectrum including from supersonic to ultraviolet frequencies, or storage media that convey information using essentially any recording technology including magnetic tape, cards or disk, optical cards or disc, and detectable markings on media including paper.

The invention claimed is:

1. A method comprising:
receiving, by a decoding device, encoded audio information and metadata associated with an audio signal, the metadata including one or more parameter values specifying dynamic range compression (DRC) according to a first profile associated with a first reference reproduction level, and one or more parameter values specifying DRC according to a second profile associated with a range of reference reproduction levels;
selecting the one or more parameter values specifying DRC according to the second profile when a playback reference reproduction level is within the range of reference reproduction levels associated with the second profile;
applying, by the decoding device, a decoding process to the encoded audio information to obtain subband signals representing spectral content of the audio signal;
modifying, by the decoding device, the subband signals using the one or more DRC parameter values specifying DRC according to the second profile to obtain modified subband signals with changed dynamic range characteristics; and
applying, by the decoding device, a synthesis filter bank to the modified subband signals to obtain a decoded audio signal.

2. The method of claim 1, wherein the playback reference reproduction level is specified or assumed.

3. The method of claim 1, wherein the first reference reproduction level is −31 dBFS or −20 dBFS.

4. The method of claim 1, wherein the range of reference reproduction levels is between −14 dBFS and −8 dBFS.

5. A computer program product including a non-transitory storage medium storing instructions for performing the method of claim 1.

6. An apparatus comprising:
at least a processor
memory coupled to at least the processor and configured to store instructions, which when executed by at least the processor, cause at least the processor to perform operations comprising:
receiving encoded audio information and metadata associated with an audio signal, the metadata including one or more parameter values specifying dynamic range compression (DRC) according to a first profile associated with a first reference reproduction level, and one or more parameter values specifying DRC according to a second profile associated with a range of reference reproduction levels;
selecting the one or more parameter values specifying DRC according to the second profile when a playback reference reproduction level is within the range of reference reproduction levels associated with the second profile;
applying a decoding process to the encoded audio information to obtain subband signals representing spectral content of the audio signal;
modifying, by the processor, the subband signals using the one or more DRC parameter values specifying DRC according to the second profile to obtain modified subband signals with changed dynamic range characteristics; and
applying a synthesis filter bank to the modified subband signals to obtain a decoded audio signal.

7. The apparatus of claim 6, wherein the playback reference reproduction level is specified or assumed.

8. The apparatus of claim 6, wherein the first reference reproduction level is −31 dBFS or −20 dBFS.

9. The apparatus of claim 6, wherein the range of reference reproduction levels is between −14 dBFS and −8 dBFS.

* * * * *